United States Patent
Kim et al.

(10) Patent No.: US 7,710,835 B2
(45) Date of Patent: May 4, 2010

(54) HIGH RESOLUTION TIME DETECTING APPARATUS USING INTERPOLATION AND TIME DETECTING METHOD USING THE SAME

(75) Inventors: Tae-wook Kim, Suwon-si (KR); Choong-yul Cha, Yongin-si (KR); Jae-sup Lee, Yongin-si (KR); Kang-yoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/935,424

(22) Filed: Nov. 6, 2007

(65) Prior Publication Data
US 2009/0027088 A1    Jan. 29, 2009

(30) Foreign Application Priority Data
Jul. 23, 2007    (KR) ............. 10-2007-0073456

(51) Int. Cl.
*G04F 8/00* (2006.01)
*G04F 10/00* (2006.01)
(52) U.S. Cl. .................. 368/120; 341/155
(58) Field of Classification Search .......... 368/120, 368/113, 118; 327/161; 341/155, 156, 166
See application file for complete search history.

(56) References Cited

U.S. PATENT DOCUMENTS

| | | | |
|---|---|---|---|
| 6,707,727 B2* | 3/2004 | Tamura et al. | 365/192 |
| 7,450,049 B2* | 11/2008 | Yamauchi et al. | 341/157 |
| 2003/0081472 A1* | 5/2003 | Lin | 365/200 |
| 2003/0197631 A1* | 10/2003 | Comer et al. | 341/131 |
| 2004/0046597 A1* | 3/2004 | Alon et al. | 327/278 |
| 2005/0258883 A1* | 11/2005 | Farjad-rad et al. | 327/295 |
| 2008/0238652 A1* | 10/2008 | Henzler et al. | 340/527 |

FOREIGN PATENT DOCUMENTS
KR    10-1995-0002657 B1    3/1995

* cited by examiner

*Primary Examiner*—Felix O Figueroa
(74) *Attorney, Agent, or Firm*—Sughrue Mion, PLLC (57) ABSTRACT

A high resolution time detecting apparatus using interpolation and a time detecting method using the same are provided. The time detecting apparatus includes a delayer which generates delayed signals by sequentially delaying a reference signal using a plurality of delay elements, a latch unit which outputs latch signals using the delayed signals, and an interpolation unit which outputs interpolated signals using input and output signals of the delay elements. As a result, a high resolution TDC using an interpolation and a time detecting method using the same provide improved performance of digital PLL, high resolution digital signal output at a low power consumption, and controlled circuit size.

10 Claims, 7 Drawing Sheets

HIGH RESOLUTION TIME DETECTING APPARATUS USING INTERPOLATION AND TIME DETECTING METHOD USING THE SAME

CROSS-REFERENCE TO RELATED APPLICATION

This application claims priority from Korean Patent Application No. 2007-0073456, filed Jul. 23, 2007 in the Korean Intellectual Property Office, the entire disclosure of which is hereby incorporated by reference.

BACKGROUND OF THE INVENTION

1. Field of the Invention

Apparatuses and methods consistent with the present invention relate to detecting time, and more particularly to a high resolution time detecting apparatus using an interpolation and a time detecting method thereof.

2. Description of the Related Art

Advanced semiconductor processing has increased speed of transistors and decreased supply voltages. As the decrease in supply voltage increases sensitivity of analog circuit, more and more circuits are designed in digital domain rather than the previous analog domain. A phase locked loop (PLL) is one example.

A PLL generally refers to the circuits that obtain stable oscillation outputs at the same frequency as a reference signal by use of a negative feedback circuit. A PLL generally includes a phase comparator that compares and detects a phase difference between an input frequency as a reference and an output from a voltage controlled oscillator (VCO), a low band loop filter that removes high frequency component and determines synchronization or response characteristic of a PLL, a frequency divider, and the VCO that changes frequency linearly with reference to a DC voltage applied. By the term 'phase locked,' it means that an output frequency completely matches an input frequency, except for a different phase.

However, change of analog PLL to digital brought about a problem that a high frequency signal of VCO is not converted into a digital signal to a satisfactory resolution.

As a result, a method is required, which improves performance of a digital PLL to output high resolution digital signal with low power consumption, and without compromising compactness of an integrated circuit.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a high resolution time-to-digital converter (TDC) using an interpolation, and a time detecting method using the same.

According to an aspect of the present invention, there is provided a time detecting apparatus, including a delayer which generates delayed signals by sequentially delaying a reference signal using a plurality of delay elements, a latch unit which outputs latch signals using the delayed signals, and an interpolation unit which outputs interpolated signals using input and output signals of the delay elements.

The interpolated signals may be generated by latching input and output signals of the delay elements.

The input and output signals of the delay elements may be input to the interpolation unit differentially.

The interpolation unit may latch the input and output signals of the delay elements to output interpolated signals.

The interpolation unit may output the interpolated signals using the input and output signals of the delay elements, and the latch unit may output latched signals using the interpolated signals.

The latch unit may include at least one of a plurality of SR latches each comprising a plurality of D latches and comparators.

According to an aspect of the present invention, there is provided a time detecting method, including generating delayed signals by sequentially delaying a reference signal using a plurality of delay elements, outputting latch signals using the delayed signals, and outputting interpolated signals using input and output signals of the delay elements.

The interpolated signals may be generated by latching input and output signals of the delay elements.

The input and output signals of the delay elements may be input to the interpolation unit differentially.

The outputting the interpolated signals may include latching the input and output signals of the delay elements and outputting interpolated signals.

The outputting the interpolated signals may include outputting the interpolated signals using the input and output signals of the delay elements, and the outputting the latched signals may include outputting the latched signals using the interpolated signals.

The outputting the latched signals may include outputting the latched signals using at least one of a plurality of SR latches each comprising a plurality of D latches and comparators.

According to an aspect of the present invention, there is provided a time detecting method, including generating first delayed signals by sequentially delaying a reference signal using a plurality of first delay elements, generating second delayed signals by sequentially delaying a differential signal of the reference signal using a plurality of second delay elements, outputting latched signals using the first and second delayed signals, and outputting interpolated signals using input and output signals of the first delay elements respectively.

The time detecting method may further include outputting a balance signal using input and output signals of the second delay elements respectively.

The outputting the interpolated signals may include outputting odd-numbered interpolation signals using input and output signals of even-numbered delay elements of the first delay unit, and outputting even-numbered interpolation signals using input and output signals of odd-numbered delay elements of the second delay unit.

The outputting the interpolated signals may include outputting even-numbered interpolated signals using input and output signals of odd-numbered delay elements of the first delay unit, and outputting odd-numbered interpolated signals using input and output signals of even-numbered delay elements of the second delay unit.

BRIEF DESCRIPTION OF THE DRAWINGS

The above and other aspects of the present invention will be more apparent from the following detailed description of exemplary embodiments with reference to the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
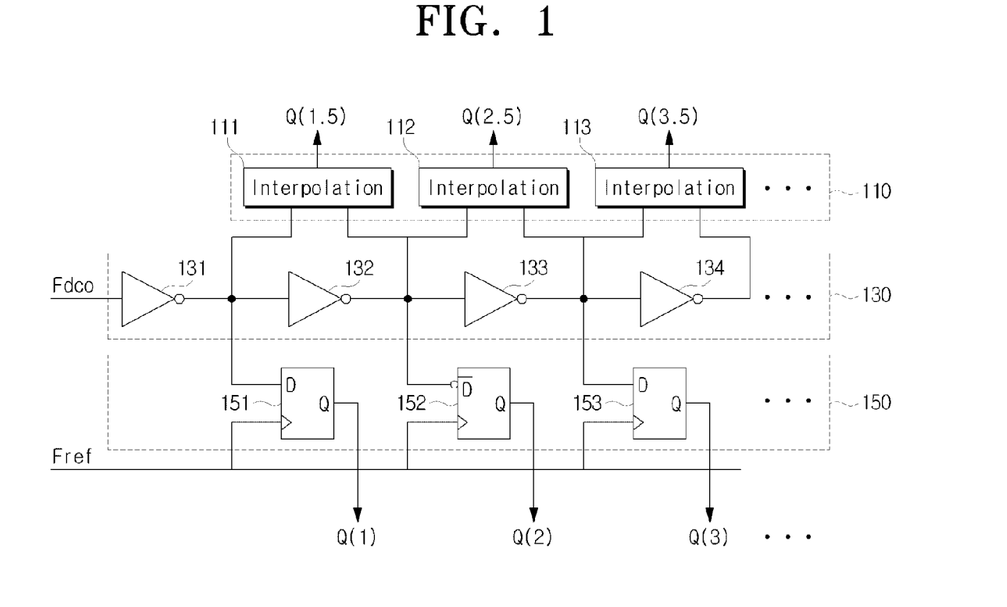
FIG. 1 illustrates a time-to-digital converter (TDC) according to an exemplary embodiment of the present invention.

FIG. 1 illustrates a time-to-digital converter (TDC) according to an exemplary embodiment of the present invention. The TDC receives an input signal (Fdco) 20 and outputs a high resolution digital signal.

Referring to FIG. 1, the TDC according to an exemplary embodiment of the present invention may include an interpolation unit 110, a delayer 130 and a latch unit 150.

The delayer 130 may include a plurality of inverters 131, 132. The first inverter 131 receives an input signal (Fdco) 20 and outputs a signal to the second inverter 132, a first D latch 151 and a first interpolation unit 111. An output signal is delayed with reference to the input signal (Fdco) 20 and has a phase opposite to that of the input signal (Fdco) 20.

The first D latch 151 receives a signal from the first inverter 131 and digitizes the received signal to Q(1) whenever a reference signal (Fref) rises.

The second inverter 132 receives a signal from the first inverter 131 and outputs a signal to the third inverter 133, a second D latch 152, the first interpolation unit 111, and a second interpolation unit 112. Output signal is delayed from the input signal (Fdco) 20 approximately two times longer than the delay by the first inverter 131, and has a phase same as the input signal (Fdco) 20.

The second D latch 152 receives a signal from the second inverter 131 and outputs a phase-inverted value Q(2) of a signal which is received at a time point of reference signal rising whenever a reference signal rises. The phase-inverted value of received signal is Q(2) because unlike the first D latch 151, the second D latch 152 has a bubble in its receiving part to change phase of signal.

The third D latch 153 operates substantially in the same manner as the first and second D latches 151, 152, and so will not be explained in detail for the sake of brevity.

The first interpolation unit 111 generates a first interpolation signal using a signal output from the first inverter 131 and a signal output from the second inverter 132. In detail, each of the interpolation units 111, 112, 113 may be implemented as an SR latch that includes D latch or comparator.

By using an SR latch that includes D latch or comparator, a signal can be input to the interpolation unit 110 differentially. A D latch has the characteristic that does not cause an output value in undefined state, while an SR latch can have an undefined state. Accordingly, the comparator is added to the SR latch to ensure that an output value does not have undefined state. The SR latch including the comparator will be explained below in detail with reference to FIG. 5.

The first interpolation unit 111 latches a signal output from the first inverter 131 and a signal output from the second inverter 132 to generate a first interpolation signal. The resultant first interpolation signal has a delay that is a half of the delay between a signal output from the first inverter 131 and a signal output from the second inverter 132. Accordingly, the first interpolation signal is used as an intermediate signal between the signals output from the first and second inverters 131, 132.

Generating of a first interpolation signal and outputting of Q(1.5) will be explained in detail below with reference to FIG. 2.

Figure 2:
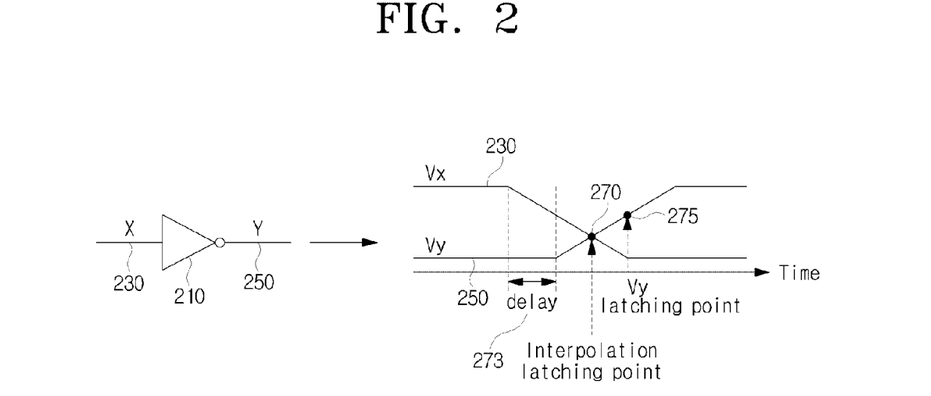
FIG. 2 is a view provided to explain a method of using interpolation in a state where a latch is connected with input and output ends of an inverter.

FIG. 2 is a view provided to explain a method of using interpolation in a state where a latch is connected with input and output ends of an inverter. The inverter 210 receives signal X 230 and outputs signal Y 250. The signal Y 250 has a delay 273 and phase opposite to the signal X 230 as it passes through the inverter 210.

Vy latching point 275 represents a state in which a digital signal output from the inverter can be input to the D latch of the latch unit to be converted from 0 to 1 or vice versa. Accordingly, the level of digital signal changes at the Vy latching point 275. The signal X 230 past the Vy latching point 275 becomes low level, and the signal Y 250 past the Vy latching point 275 becomes high level.

Interpolation latching point 270 represents a state in which a signal Y 250 output from the inverter and the signal X 230 input to the inverter are input to the interpolation unit, so that the digital signals can be converted from 0 to 1 or vice versa. In other words, a digital signal changes its level at the interpolation latching point 270. Accordingly, an interpolation signal becomes low or high level as it passes the interpolation latching point 275.

In a time axis, the interpolation latching point 270 is ahead of Vy latching point 275, and thus is added between a latching signal of signal X 230 and a latching signal of signal Y 250. Accordingly, digital signal value corresponding to latching signal of signal X 230, latching signal of signal Y 250, and interpolation signal are output if a reference signal rises, and as these operations reiterate using input and output signals of the inverters, the TDC has a twice higher resolution.

Referring back to FIG. 1, the first interpolation unit 111 latches signals differentially input from the first and second inverters 131, 132. The delay between the interpolation signal and the input signal (Fdco) is half the delay between the input signal (Fdco) and the signal output from the first inverter 131. Digital value of Q(1.5) is then obtained regarding the first interpolation signal at a point of rising of a reference signal.

The second interpolation unit latches signals output from the second and third inverters 132, 133 and generates a second interpolation signal. The third interpolation unit 113 latches signals output from the third and fourth inverters 133, 134 and generates a third interpolation signal.

The operations at the second and third interpolation units 112, 113, which are identical to those at the first interpolation unit 111, produce Q(2.5) and Q(3.5) regarding the interpolation signals at the time of rising of reference signal respectively.

As explained above, TDC resolution is doubled by using the first, second and third interpolation units 111, 112, 113 to output Q(1.5), Q(2.5) and Q(3.5), and reiterating the operations at each interpolation.

Figure 3:
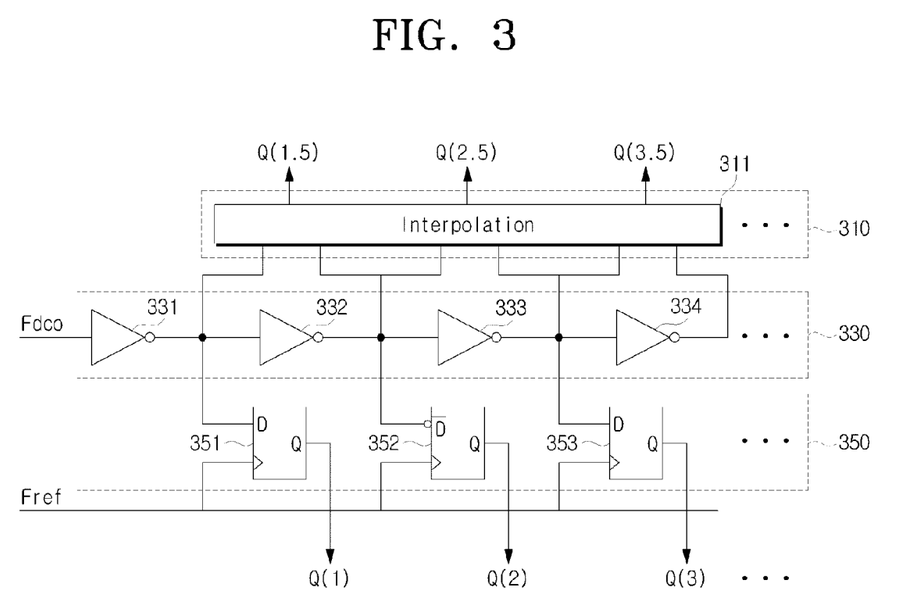
FIG. 3 illustrates a TDC according to another exemplary embodiment of the present invention.

FIG. 3 illustrates a TDC according to another exemplary embodiment of the present invention.

The TDC according to another exemplary embodiment of the present invention may include a delayer 330, a latch unit 350, and an interpolation unit 310, as in the previous exemplary embodiment explained with reference to FIG. 1.

The delayer 330 includes a plurality of inverters 331, 332, 333, and the latch unit 350 includes a plurality of D latches 351, 352, 353. The operations of the delayer 330 and the latch unit 350 are the same as explained above with reference to FIG. 1.

While FIG. 1 illustrates a structure of receiving input and output signals of a single inverter distributably through a plurality of interpolation units and constructing an interpolation signal, FIG. 3 illustrates the interpolation unit 310 conduct interpolation by using phase-inverted signals being received from the input and output signals of different inverters.

For example, interpolating signals output from the fourth and first inverters 334, 331 using D latch would bring about the same effect obtained by interpolating using signals from both ends of the third inverter 333. The interpolation unit illustrated in FIG. 3 may alternatively use input and output signals of a single inverter.

The interpolation is processed by use of an SR latch that includes D latch or comparator, and outputs digital values of Q(1.5), Q(2.5), Q(3.5), and so on.

Figure 4:
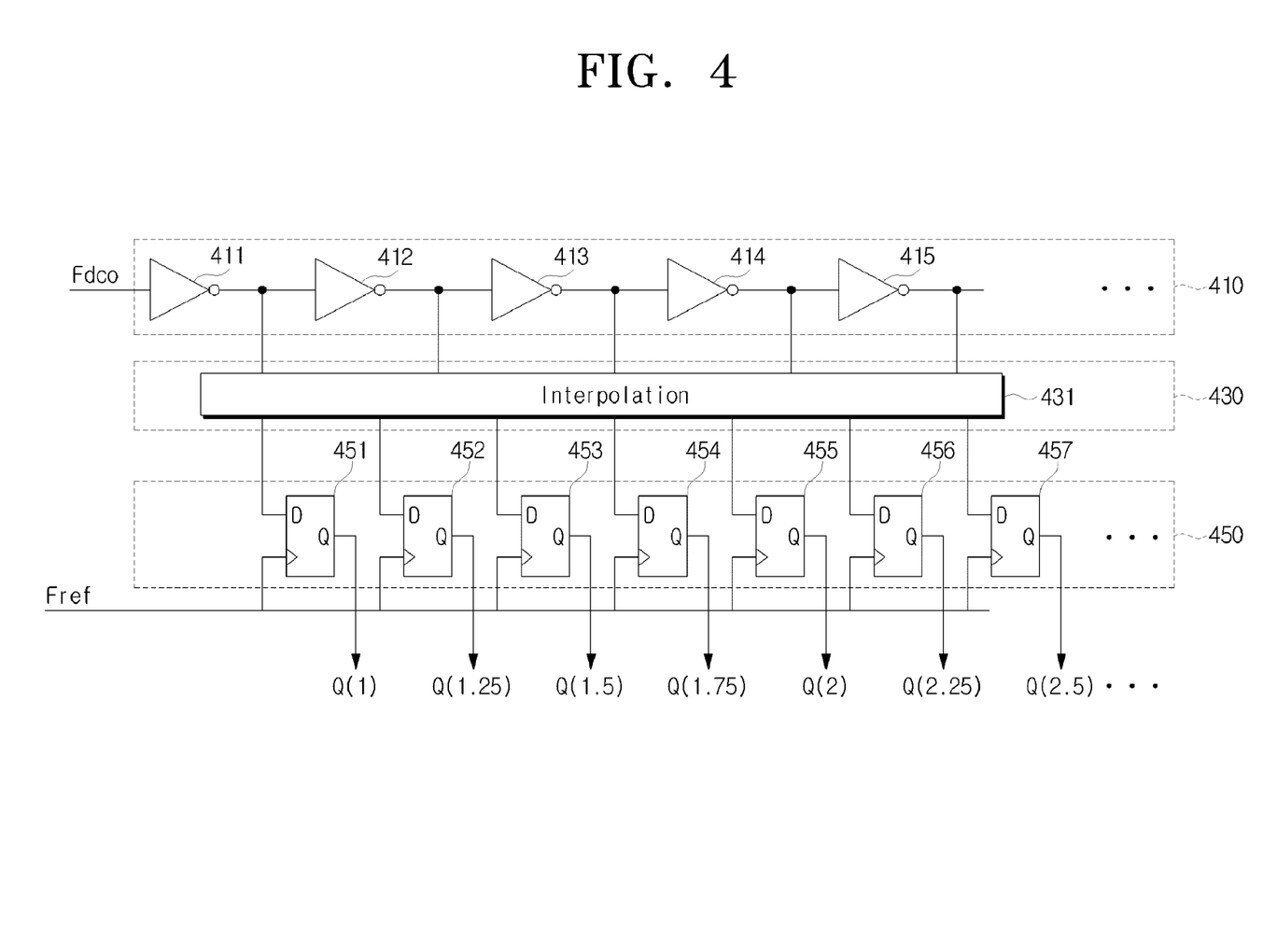
FIG. 4 illustrates a TDC according to yet another exemplary embodiment of the present invention.

FIG. 4 illustrates a TDC according to yet another exemplary embodiment of the present invention.

The TDC exemplified in FIG. 4 includes a delayer 410, an interpolation unit 430 and a latch unit 450. The delayer 410 includes a plurality of inverters 411, 412, 413. Signals output from the inverters 411, 412, 413 are input to the interpolation unit 430 without being input to the latch unit 450.

The interpolation unit 430 receives signals from the inverters, interpolates the received signals, and outputs an interpolation signal to the latch unit 450.

As mentioned above with reference to FIG. 3, the interpolation unit 430 may conduct an interpolation using signals from both ends of a single inverter, or alternatively, using phase-inverted signals received from input and output signals from different inverters and input signals, phase-inverted signals received from input and output signals from different inverters, and input signals.

The interpolation unit 430 latches the received signals and outputs a result to the latch unit 450. D latches 451, 452, 453 receive signals from the interpolation unit 430, and output values that correspond to the interpolation signals at the time of rising of reference signal (Fref).

Figure 5:
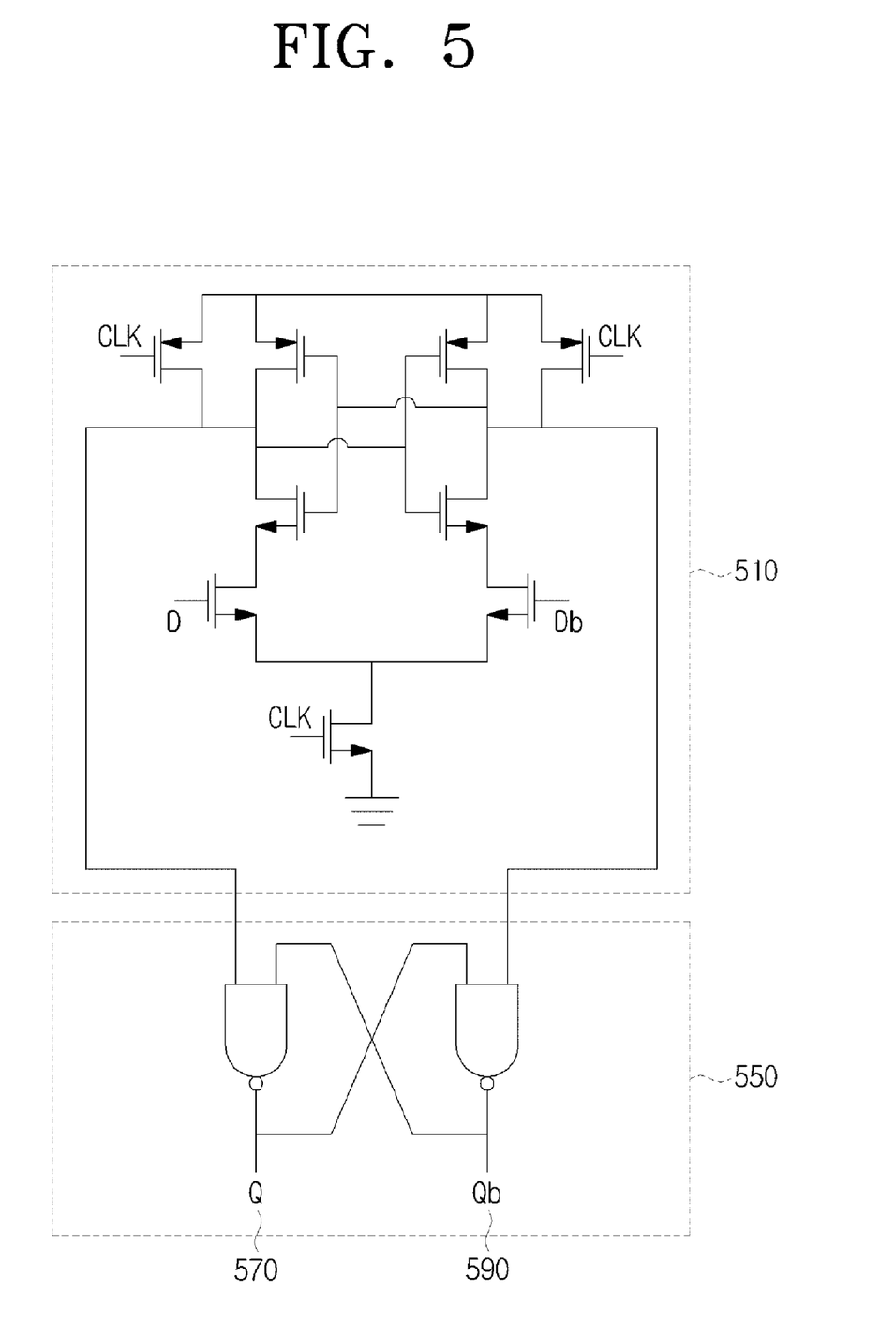
FIG. 5 illustrates a TDC according to yet another exemplary embodiment of the present invention.

FIG. 5 illustrates a TDC according to yet another exemplary embodiment of the present invention. As mentioned above, an SR latch 550, which includes a D latch or a comparator 510, is used, because signals are input to the interpolation unit differentially.

D latch is a logic circuit designed to allow no undefined state of the SR latch. Because undefined state is not caused, a digital output of the TDC becomes 1 or 0.

If an SR latch does not include the comparator 510, and if all signals input to the input end is in level 1, both a queue being output and a negative value of the queue become 0. As a result, undefined state is caused, and therefore, the comparator 510 is employed to prevent such undefined state.

Figure 6:
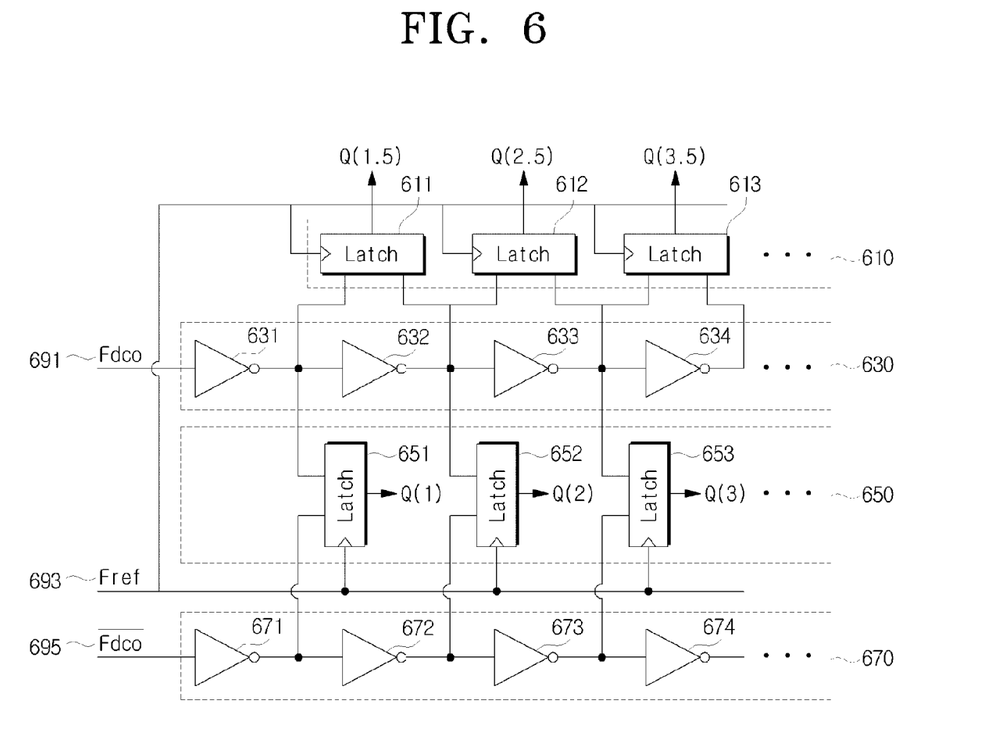
FIG. 6 illustrates a TDC according to yet another exemplary embodiment of the present invention.

FIG. 6 illustrates a TDC according to yet another exemplary embodiment of the present invention. The TDC exemplified in FIG. 6 includes a first delayer 630, a second delayer 670, a latch unit 651, and an interpolation unit 610.

The first delayer 630 includes a plurality of inverters 631, 632. The first inverter 631 of the first delayer 630 receives an input signal (Fdco) 691 and outputs a signal to the second inverter 632 of the first delayer 630, the first latch 651 and the first interpolation unit 611.

The second delayer 670 includes a plurality of inverters 671, 672. The first inverter 671 of the second delayer 670 receives a negative signal 695 of the input signal, and outputs a signal to the second inverter 672 of the second delayer 670 and the first latch 651.

The latch unit 650 includes a plurality of D latches 651, 652, 653. The first D latch 651 latches a signal output from the first inverter 631 of the first delayer 630 and a signal output from the first inverter 671 of the second delayer 670 to generate a first latch signal, and outputs a value of Q(1) that corresponds to the time of rising.

Because the first latch signal is generated by latching a signal output from the first inverter 631 of the first delayer 630 and a signal output from the first inverter 671 from the second delayer 670, the first latch signal has a delay from the input signal 691 and a negative signal 695 of the input signal, and a value of Q(1) is output at the time of rising of the delayed signal, during the rising of the reference signal 693.

The interpolation unit 610 includes a plurality of latches 611, 612, 613. The latches of the interpolation unit 610 may be implemented as an SR latch that includes a D latch or a comparator.

The first latch 311 of the interpolation unit 610 latches a signal output from the first inverter 631 of the first delayer 630 and a signal output from the second inverter 632 of the first delayer 630 to generate a first interpolation signal, and outputs a value of Q(1.5) from the time of rising.

Because the first interpolation signal is generated by latching a signal output from the first inverter 631 of the first delayer 630 and a signal output from the second inverter 632 of the first delayer 630, the first interpolation signal is delayed approximately 1.5 times the delay of the first latch signal and outputs a value of Q(1.5) at the time of rising of the delayed signal during the rising of the reference signal 693.

As the abovementioned operations reiterate at the latches, D latches of the latch unit 650 and the latches of the interpolation unit 610 each output values of delayed digital signals at the time of rising of the reference signal 693.

Figure 7:
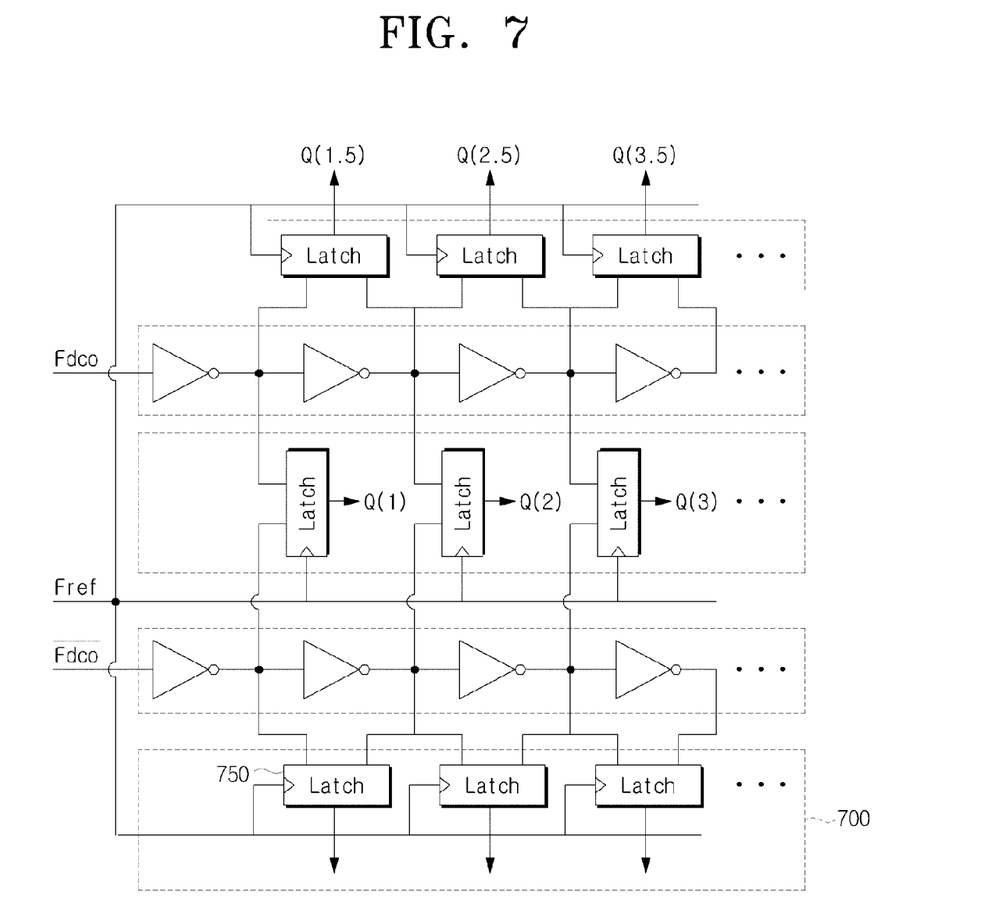
FIG. 7 illustrates a TDC according to yet another exemplary embodiment of the present invention.

FIG. 7 illustrates a TDC according to yet another exemplary embodiment of the present invention.

Most of the circuit structure exemplified in FIG. 7 is identical to those exemplified in FIG. 6, except for the bottom latch unit 700. Therefore, only the bottom latch unit 700 will be explained, while the like elements will not be explained for the sake of brevity.

FIG. 7 shows another latch unit 700 employed to prevent an incorrect output or an error due to unbalanced structure of a TDC circuit and subsequent difference in a delay chain which can be generated when latches are used in only one delay chain as illustrated in FIG. 6.

As another latch unit 700 is added to the bottom end, achieving balance with the interpolation at the upper end, the entire circuit has balanced structure of upper and lower sides. As a result, circuit error due to different delays can be avoided.

Figure 8:
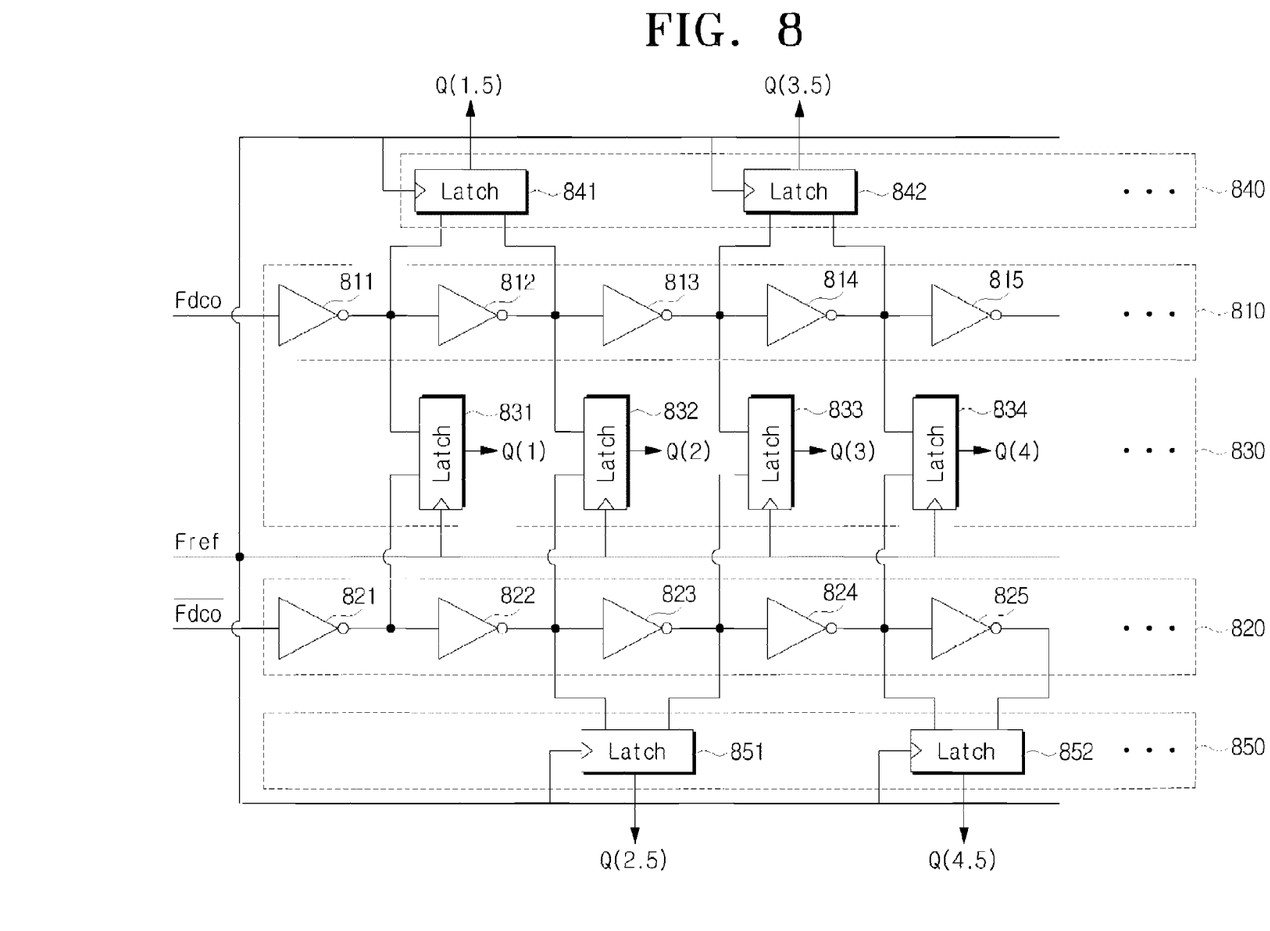
FIG. 8 illustrates a TDC according to yet another exemplary embodiment of the present invention.

FIG. 8 illustrates a TDC according to yet another exemplary embodiment of the present invention.

The TDC exemplified in FIG. 8 includes a first delayer 810, a second delayer 820, a latch unit 830, a first interpolation unit 840, and a second interpolation unit 850.

The first delayer 810, the second delayer 820 and the latch unit 830 operate substantially in the same manner as those illustrated in FIGS. 6 and 7, and so will not be explained in detail for the sake of brevity.

The TDC exemplified in FIG. 8 includes two interpolation units 840, 850 like the TDC exemplified in FIG. 7. The difference is that the first interpolation unit 840 generates a digital signal by latching input and output signals of the even-numbered inverters 812, 814 of the first delayer 810, and the second interpolation unit generates a digital signal by latching input and output signals of the odd-numbered inverters of the second delayer 820.

At the time of rising of the reference signal (Fref), the latches of the interpolation units 840, 850 output values corresponding to the time of rising.

While the bottom latch unit 700 of FIG. 7 can balance the circuit, implementing the bottom latch unit 700 that does not have any specific function may be wasting. The top and bottom latches of the TDC of FIG. 8 are more economical, because these use a half of the latches used in the TDC of FIG. 7.

Because the first interpolation unit 840 uses signals from the even-numbered inverters 812, 814 of the first delayer 810, and the second interpolation unit 850 uses the odd-numbered inverters 823, 825 of the second delayer 820, delay chain balance is provided and as a result, delay error is minimized.

While some exemplary embodiments have been explained so far regarding a time detecting apparatus using a TDC, one will understand that this is only for the illustrative purpose and that the concept of the present invention can be applied to other alternatives. For example, a frequency detecting apparatus using a frequency-to-digital converter (FDC) may be used.

Furthermore, while the latch unit and the interpolation unit implemented D latches in the above exemplary embodiments, one will understand that other elements may also be implemented as long as these allow differential input and prevent undefined state like an SR latch having D latch and comparator.

Furthermore, while the exemplary embodiments set forth above with reference to FIGS. 3 and 4 perform interpolation using signals with inverse phase and a delay, alternatively, interpolation is possible by using signals having the same phase and delay. Interpolation using the same phase signals can still have high and low level signals due to delay differences, and so it is possible to input signals to the latches differentially.

Furthermore, while the first interpolation unit uses signals of even-numbered inverters 812, 814 of the first delayer 810 and the second interpolation unit uses signals of the odd-numbered inverters 823, 825 of the second delayer 820 in the exemplary embodiment set forth above with reference to FIG. 8, this is only an example employed for convenience of explanation. Alternatively, the first interpolation unit may use signals of the odd-numbered inverters 812, 814 of the first delayer 810, and the second interpolation unit uses signals of the even-numbered inverters 823, 825.

As explained above, according to the exemplary embodiments of the present invention, a high resolution TDC using an interpolation and a time detecting method using the same provide improved performance of digital PLL, high resolution digital signal output at a low power consumption, and controlled circuit size.

While certain exemplary embodiments of the present invention have been shown and described with reference to certain preferred embodiments thereof, it will be understood by those skilled in the art that various changes in form and details may be made therein without departing from the spirit and scope of the invention as defined by the appended claims and their equivalents.

What is claimed is:

1. A time detecting apparatus, comprising:
    a delayer which generates delayed signals by sequentially delaying an input signal using a plurality of delay elements wherein the plurality of the delay elements are arranged in a series;
    a latch unit which receives the delayed signals directly from the delay elements and outputs latch signals using the delayed signals; and
    an interpolation unit which outputs interpolated signals using the delayed signals of the delay elements,
    wherein the interpolation unit outputs an interpolated signal using output signals of only two different delay elements of the delay elements, the two different delay elements being non-consecutive delay elements in the series.

2. The time detecting apparatus of claim 1, wherein the interpolated signals are generated by latching the delayed signals of the delay elements.

3. The time detecting apparatus of claim 1, wherein the delayed signals of the delay elements are input to the interpolation unit differentially.

4. The time detecting apparatus of claim 1, wherein the interpolation unit latches the delayed signals of the delay elements to output interpolated signals.

5. The time detecting apparatus of claim 1, wherein the latch unit comprises at least one of a plurality of SR latches each comprising a plurality of D latches and comparators.

6. A time detecting method, comprising:
    generating delayed signals by sequentially delaying an input signal using a plurality of delay elements wherein the plurality of the delay elements are arranged in a series;
    outputting, by a latch unit directly receiving the delayed signals, latch signals using the delayed signals of the delay elements; and
    outputting interpolated signals using the delayed signals of the delay elements,
    wherein the outputting the interpolated signals comprises outputting an interpolated signal using output signals of only two different delay elements of the delay elements, the two different delay elements being non-consecutive delay elements in the series.

7. The time detecting method of claim 6, wherein the interpolated signals are generated by latching the delayed signals of the delay elements.

8. The time detecting method of claim 6, wherein the delayed signals of the delay elements are input to the interpolation unit differentially.

9. The time detecting method of claim 6, wherein the outputting the interpolated signals comprises latching the delayed signals of the delay elements and outputting interpolated signals.

10. The time detecting method of claim 6, wherein the outputting the latched signals comprises outputting the latched signals using at least one of a plurality of SR latches each comprising a plurality of D latches and comparators.

* * * * *